United States Patent [19]

Hopf et al.

[11] Patent Number: 4,541,110
[45] Date of Patent: Sep. 10, 1985

[54] CIRCUIT FOR AUTOMATIC SELECTION BETWEEN SPEECH AND MUSIC SOUND SIGNALS

[75] Inventors: Reinhard Hopf, Placht-Weissath, Fed. Rep. of Germany; Jean-Francois Longchamp, Lausanne, Switzerland

[73] Assignee: Blaupunkt-Werke GmbH, Hildesheim, Fed. Rep. of Germany

[21] Appl. No.: 485,188

[22] Filed: Jan. 21, 1982

[30] Foreign Application Priority Data

Jan. 24, 1981 [DE] Fed. Rep. of Germany ....... 3102385

[51] Int. Cl.³ .............................................. G10L 1/00
[52] U.S. Cl. .................................................. 381/46
[58] Field of Search ................................... 381/41–43, 381/46; 369/51; 358/900

[56] References Cited

U.S. PATENT DOCUMENTS

| 2,761,897 | 9/1956 | Jones | 381/41 |
| 3,304,372 | 2/1967 | VonFilipowsky | 179/2 |
| 3,864,519 | 2/1975 | Owen | 381/46 |
| 4,028,496 | 6/1977 | LaMarche | 381/46 |
| 4,281,218 | 7/1981 | Chuang et al. | 381/46 |
| 4,314,100 | 2/1982 | Reuther et al. | 381/42 |

OTHER PUBLICATIONS

Predmore, "Speech-Music Discriminator", *Rod-Elec.*, Sep. 1956, pp. 63–65.

Primary Examiner—E. S. Kemeny
Attorney, Agent, or Firm—Frishauf, Holtz, Goodman & Woodward

[57] ABSTRACT

Speech versus music is decided by comparing the presence of pauses greater than 32, 60 and 500 ms in the lower input spectrum, and 4 ms in the higher input spectrum.

20 Claims, 6 Drawing Figures

CIRCUIT FOR AUTOMATIC SELECTION BETWEEN SPEECH AND MUSIC SOUND SIGNALS

This invention concerns a circuit by which a keyed-in preference for either speech or music signals may control selection among sources of sound reproducing signals for speech or for music, as the case may be, by checking the nature of signals from a signal source considered for selection, determining whether it is producing the desired type of signals and then either selecting that source or seeking another one. The invention lends itself readily to combination with a searching type of signal selection system, as are now increasingly used in radio receivers for sound broadcast.

Many radio and television receivers are equipped with manual tone controls that operate either stepwise or continuously. Circuits are known for automatic changing of the tone control, particularly operating on the frequency characteristic of the audio amplifier, when there is a transition from speech to music reception or vice versa, as illustrated by German Federal Patent No. 1 249 932.

It is an object of the present invention to provide means for determining whether speech or music is being received from a sound signal source which are capable of operating in the absence of a hearer and, if the one of these types of signals that is desired is not being received, able to start a signal scan for bringing in a signal of the desired type. Such a device must be much more reliable in operation than an automatic tone adjustment of the audio amplifier, since the sound reproduction apparatus must be switched over to another signal instead of merely having the tone characteristics of the amplifier modified slightly.

Circuits are known for causing the scanning operation of a signal selection system to start when a signal being received falls below a certain threshold amplitude, as disclosed in German Federal Pat. No. 2 229 796.

It is also known, as general information, that speech is made up of an irregular sequence of voiced and voiceless sounds to represent words and sentences formed of these sounds. This phenomenon can also be described technically as a sequence of passages through zero (null transitions) of the sound pressure amplitude with pauses occurring statistically between between words and between sentences. These pause periods, according to investigation and study are greater than 60 msec in duration in about 90% of all cases and the duration of the individual null transition sequences is rarely longer than 500 msec.

THE INVENTION

In its broadest aspect, the invention accordingly detects or counts the pauses in the signal that exceed in duration a first predetermined short period of time, such as 60 ms, during a second longer period of time, such as 500 ms and provides a recognition signal for confirming or for switching over the signal source connection when no pause of the first predetermined duration is found to occur during a period of the second predetermined duration.

Further investigation has shown that voiced speech sounds essentially occupy the frequency region up to about 3 kHz, whereas the voiceless sounds of speech are found mainly in the frequency region getween 6 and 10 kHz. It is therefore desirable in a further elaboration of the invention to provide in a known way for the subdivision of the sound reproduction signal into a lower frequency component and a higher frequency component.

Both of these components, one preferably selected by a low pass filter with a cut-off frequency of about 3000 kHz and the other selected by a band pass filter having cut-off frequencies at 6 and 10 kHz, are each provided with means for converting the component signals into a sequence of pulses, followed by differentiating means for providing derived sequences of pulses corresponding to the trailing edges of the pulses of the sequences first obtained.

Logic circuits equipped with timing circuits related to pause lengths and intervening uninterrupted signal durations are used to indicate whether a music signal or a speech signal is being observed. These logic circuits are further described below with the assistance of the drawings.

The invention is further described by way of illustrative example with reference to the annexed drawings, in which.

Description of the Illustrated Embodiment

Figure 1:
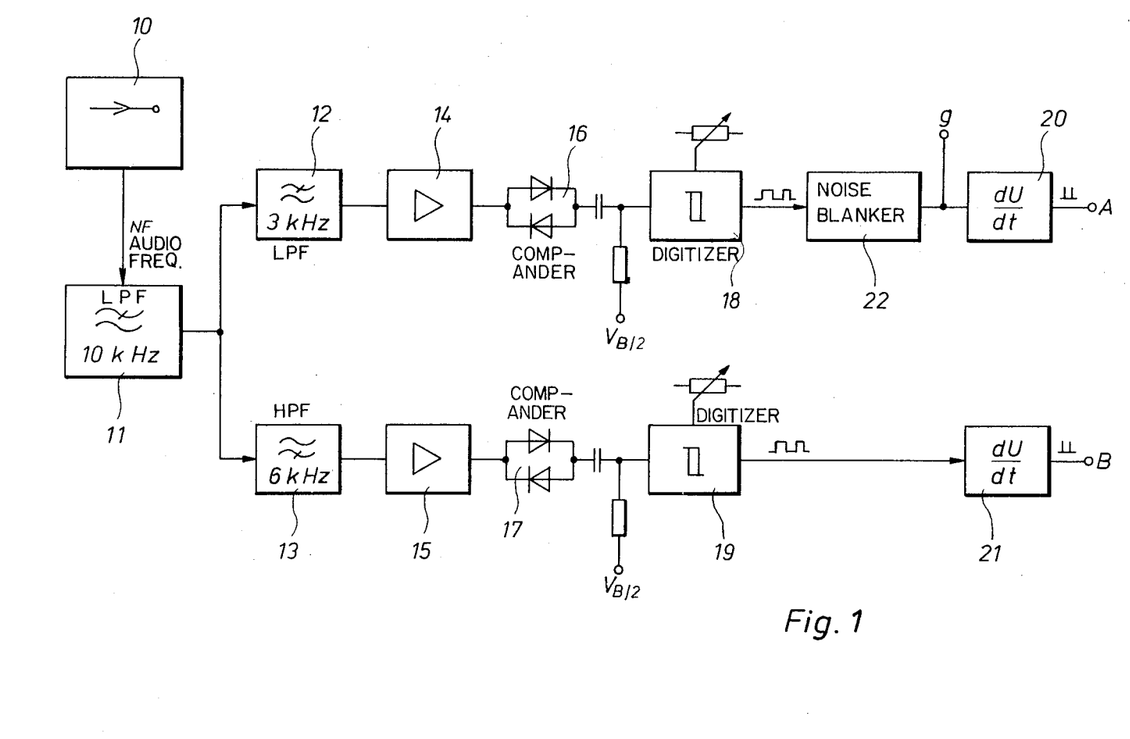
FIG. 1 is a circuit diagram in block form illustrating the separation of a received signal into low frequency and high frequency components and then obtaining from each component a sequence of pulses which is in each case differentiated to provide a sequence of derived pulses.
Figure 2:
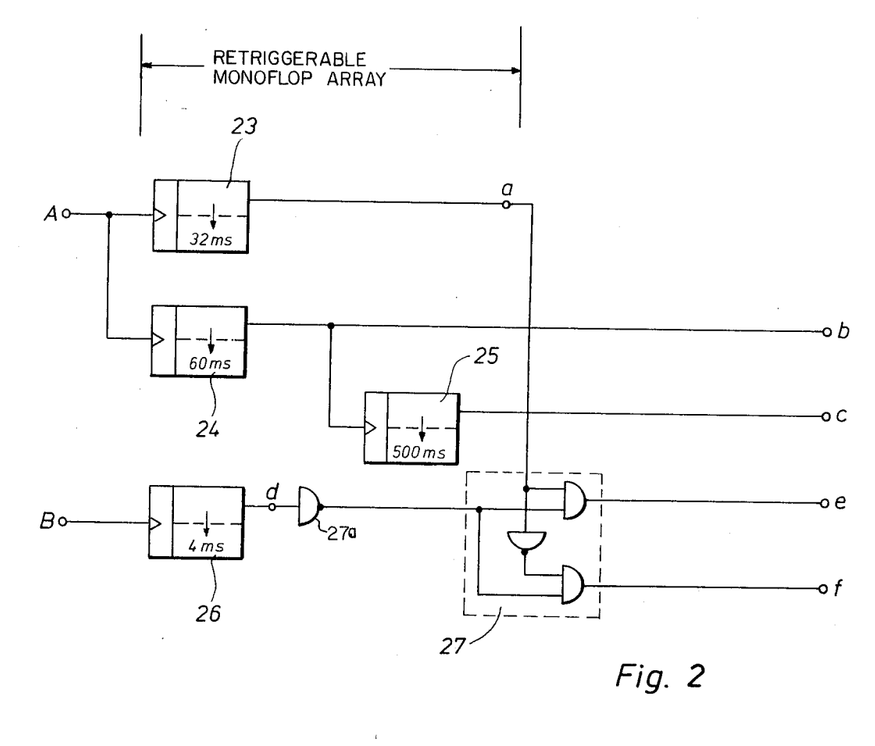
FIG. 2 is a diagram of a block circuit for processing the principal outputs of the circuit of FIG. 1 to obtain another set of outputs.
Figure 3:
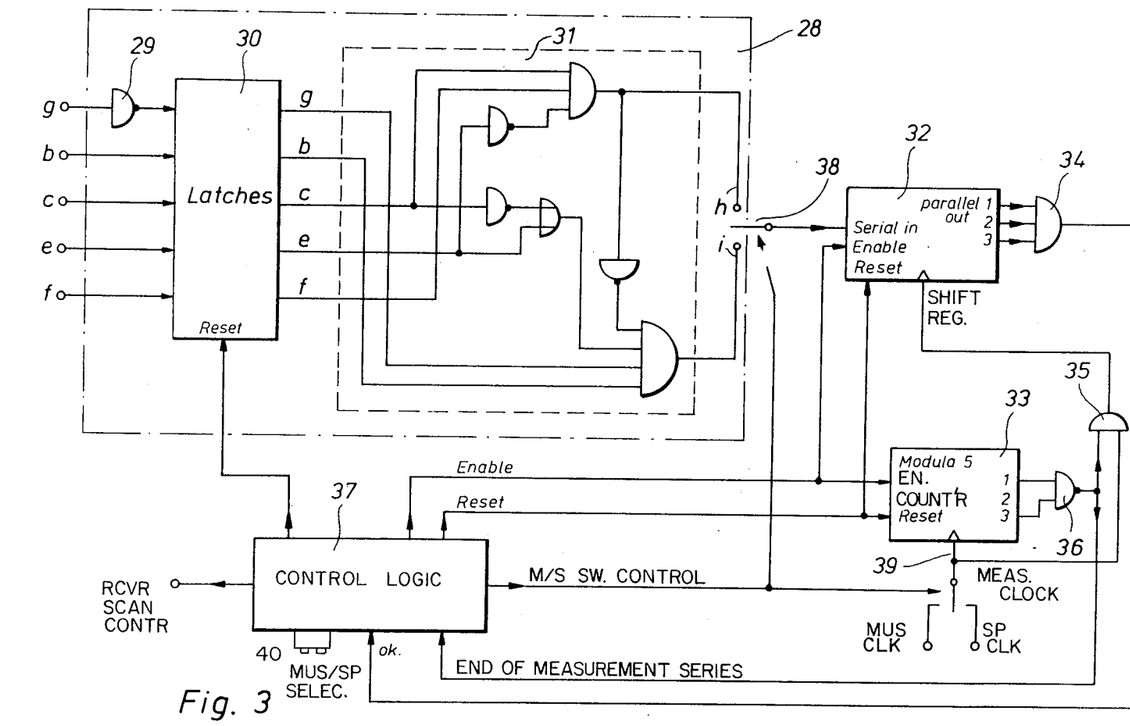
FIG. 3 is a circuit diagram in block form of a further logic circuit and also control logic responsive to the outputs of the logic circuit of FIG. 2 and one output of the circuit of FIG. 1 for producing one output identifying the presence of music and another output identifying the presence of speech signals and means for making repeated determinations in order to improve the reliability by applying further criteria.

The first three figures of the drawings respectively represent parts of the same embodiment, the outputs A and B of FIG. 1 corresponding to the similarly denominated inputs of FIG. 2, and the output g of FIG. 1 and the outputs b,c,e and f of FIG. 2 corresponding to the similarly designated inputs of FIG. 3.

In the illustrated embodiment, audio-frequency signals from the source 10 of FIG. 1 are investigated with respect to the following three criteria for recognizing the nature of the represented sound:

1. Duration of pauses
2. Duration of sequences of null transitions (sign changes) that are not interrupted by any pause, hence the signal sequence length,
3. Simultaneous or alternate appearance of pauses in a lower frequency region extending up to about 3 kHz and in a higher frequency region between 6 and 10 kHz.

From the results of this investigation, it is possible to differentiate between the presence of music information and the presence of speech information. Therefore, if for example music is desired and is selected by a manual input to the apparatus, it is possible to detect which transmitters are sending music at the time of the investigation. The same applies for spoken programs, such as news, radio plays, interviews and the like.

The above-named criteria are established on the basis of characteristics established by experiment. As already mentioned, speech consists of null transitions in close succession interspersed with pauses that occur between words and sentences with random timing. The pause durations are greater than 60 ms in about 90% of all cases. In speech, there are rarely successions of null transitions that are longer than 500 ms and are not interrupted by at least one pause. Speech, moreover, is characterized by a sequence of voiced and unvoiced sounds. Voiced sounds appear only in the lower frequency region extending up to about 3 kHz, while unvoiced sounds (hissing and explosive sounds), in contrast to the voiced sounds, appear only in an upper frequency region extending up to about 10 kHz. Music, on the other hand, is distinguished by long continuous successions of null transitions. In the case of music, there are closely following sequences of null transitions uninterrupted by pauses that last substantially longer than 500 ms. Furthermore, in music most of the time there are either simultaneously high-pitched and low-pitched sounds, or only low-pitched sounds.

The recognition criteria are accordingly so set, that when the uninterrupted close sequence of null transitions lasts longer than a predetermined period, in this case 500 ms, while no pause appears in the upper or lower frequency region (which is to say, sounds appear simultaneously in the upper and lower frequency regions), or else a pause occurs in the upper frequency region but none in the lower frequency region (meaning that there is no hissing sound), music will then be recognized. On the other hand, speech will be recognized if during the length of a measuring period there are pauses in the lower frequency region when none appear in the upper frequency frequency region (presence of a hissing sound) or the length of uninterrupted sequences of null transitions is not greater than the predetermined duration, namely 500 ms, and moreover, while at the same time there is no recognition of music and, furthermore, the spacing between closely following null transitions, indicating a pause, is greater than a predetermined time, namely 60 ms in this case. For comparison of the occurrence of pauses in the upper and lower frequency regions, however, different pause criteria are used for the time spacing of successions of closely succeeding null transitions, the threshold in the lower frequency region being 32 ms and in the upper frequency region 4 ms.

In order to investigate the received audio signal with reference to the above-mentioned decision criteria, the frequency range of the signal is subdivided to obtain a component in an upper frequency range from 6 to 10 kHz and a component in a lower frequency range extending from the threshold of audibility up to 3 kHz. The audio signal components in these two frequency regions are then converted respectively into two pulse sequences. The conversion is so performed that each negative-going pulse flank represents a positive-going null transition and each positive-going pulse flank represent either a negative-going null transition or the beginning of a pause. For this purpose, as further described below, there are provided comparators that are so constituted that within a certain period (here 2 ms) after the last null transition they flop back into their initial condition (which is here the logic value "1"). The decision criteria designated above as 1. and 2., thus the pulse durations and the duration of uninterrupted sequences of null transitions, are applied to the pulse sequences formed from the audio signal component in the lower frequency region.

The portion of the circuit of the illustrated embodiment that is shown in FIG. 1 provides the preparation of the audio signal provided by a radio receiver 10. The audio frequency output of the receiver 10 is supplied to a first low-pass filter 11 having a cut-off frequency of 10 kHz. The remaining frequency region of the audio signal coming out of the low-pass filter 11 is then supplied, in parallel, to the filters 12 and 13 for subdivision and selection of 2 components having different frequency ranges. The filter 12 is a second low-pass filter having a cut-off frequency of 3 kHz while the filter 13 is a high-pass filter having a cut-off frequency of 6 kHz. The outputs of these 2 last-mentioned filters are then respectively supplied to similar chains of circuits for further processing, namely, in the case of the low-pass filter 12, the amplifier 14, the compandor 16 and the pulse-forming comparator 18. Similarly, the output of the high-pass filter 13 is supplied to the chain of circuits composed of the similarly organized amplifier 15, compandor 17 and pulse-forming comparator 19. The amplification factor of the amplifier 15, however, is 5 times as great as that of the amplifier 14. The comparators 18 and 19 each have a hysteresis value that is controlled by the background noise level as indicated in FIG. 1 by the bias voltage input to which there is supplied the voltage $V_{B/2}$. To supply this voltage a circuit (not shown) for detecting the noise level is required. The companding effect in the null neighborhood provided by the compandors 16 and 17 and the hysteresis of the comparators provide for suppression of disturbances and of irrelevent signal components.

At the output of the comparators 18 and 19 there provided respectively digital pulse sequences in which each negative-going pulse flank is produced by a positive-going null transition of the audio signals and each positive-going pulse flank is produced either by a negative-going null transition of the audio signal or by a pause beginning. Differentiating circuits 20 and 21 are respectively provided for operating on the outputs of the comparators 18 and 19 and for responding only to the positive pulse flanks. Between the comparator 18 and the differentiating circuit 20, however, there is interposed in the illustrated example a kind of disturbance filter 22 for suppressing isolated null transitions occurring during a pause and not forming part of a succession of closely grouped null transitions. This type of circuit is well-known and commonly called a "noise blanker" and is particularly useful where automotive engine ignition interference is present.

The outputs of the differentiating circuits 20 and 21 are respectively designated A and B, while the output of the noise pulse filter 22 (or the input of the differentiating circuit 20 when no such filter is used) is brought out to a terminal designated g where the logic condition at that point of the circuit is made available.

For measuring the recognition criteria such as pause durations, duration of uninterrupted sequences of null transitions, simultaneous or alternating occurrence of pauses in the different frequency regions, a total of 4 time discrimination circuits is provided, each of which is constituted as a retriggerable monostable multivibrator, generally called a "monoflop". The 4 monoflops 23–26 have different time constants, the first monoflop 23 having a time constant of 32 ms, the second monoflop 24 a time constant of 60 ms, the third monoflop 25 a time constant of 500 ms and the fourth monoflop 26 a time constant of 4 ms. The inputs of the first and second monoflops 23 and 24 are connected with the output A of the differentiating circuit 20 and the input of the fourth monoflop 26 with the output B of the differentiating circuit 21. The third monoflop 25 has its input connected to the output b of the second monoflop 24. The outputs of the four monoflops 23–26, designated respectively a, b, c and d are in some cases directly connected, as in the case of the outputs b and c, and in other cases connected through a logic gate circuit 27, as in the case of the outputs a and d to the inputs of the decision logic 28 illustrated in FIG. 3. By means of the logic circuit 27 there is made available to the decision logic of FIG. 3 the following conditions:

$$e = a \cdot \overline{d} \text{ and } f = \overline{a} \cdot \overline{d}$$

where a and d respectively are the output signals (logical relations) respectively of the first and fourth monoflops 23 and 26 and e and f the output signals (logic condition) at the logic gate circuit 27 outputs e and f of FIG. 2. The inputs of the decision logic 28 are then connected to the outputs b and c of the respective monoflops 24 and 25 and with the outputs e and f of the logic gate circuit 27.

A further input of the decision logic is connected through an inverter 29 to the output g of the circuit of FIG. 1 already defined. On its input side the decision logic 28 is provided with latches for temporary storage of the input signals until the latch is released by the control signal to the reset terminal provided for resetting all the latches at once to an initial condition. The stored signals are presented at outputs of the multiple latch unit 30 for use by the logic circuit 31.

The logical correlation circuit 31 consisting of inverters, AND-gates and OR-gates satisfies the following conditions:

$$\text{music} = c \cdot f \cdot \overline{e}$$

$$\text{speech} = b \cdot (e + \overline{c}) \cdot \overline{\text{music}} \cdot \overline{g}$$

where b and c are the signals or logic conditions present at the outputs b and c of the second and third monoflops 24 and 25, so that c is at logic value "0" so long as b continually goes to logic value "1" at intervals no greater than 500 ms, whereas "music" and "speech" represent the signals or logic conditions appearing at the respective outputs h and i of the logical correlation circuit 31. A bar above the representation of an output indicates an inverted output. g is so determined that it is always of the logic value "1", if within a measuring cycle nothing but a pause has appeared. This prevents the provision of an output signal at output h or i of the correlation circuit 31 during longer pauses and thus dispense with a decision between music and speech in such pauses.

The circuit components shown in FIG. 3, such as the shift register 32 for series-to-parallel conversion, counter 33 and logic gates 34–36 serve for improving the decision reliability of the detection circuit. With this circuit, the examination of the audio signals, with reference to the recognition criteria, can be carried out over several successive measuring intervals, in this case five of them, and a decision will be made to identify music or speech only when within a cycle of measuring intervals a predetermined number, here three, of successive identical results, has been produced. Thus, in the circuit shown, within a measurement counting cycle, speech or music must be recognized three times in succession.

The shift register 22, the counter 33 and the decision logic 28 are controlled by control logic 37, which is also arranged to provide a command signal to the receiver 10 for operating the scanning function to seek out a new transmitter signal to satisfy the sound signal selection, if necessary.

In order to select a transmission providing a music program, a manual switch control 40 connected to the control logic 37, is manually operated to indicate selection of music. The scanning function of the receiver is started, which then stops on the first transmitter signal received at an adequate level. At the same, over the output "speech/music switchover" of the control logic 37, there is produced a switching over of two electronic switches 38 and 39, by which the shift register 32 is connected with the output h of the decision logic 28 and the clock input of the counter 33 is connected with the "music" timing output of a measurement timing circuit (not shown).

The audio signal now received through the receiver 10 is investigated in the manner above described with reference to the content recognition criteria, and if the detection circuit has made the decision "music", for example, the logic value "1" will be present at the output h of the decision logic circuit 28. This output signal will be entered into the shift register 32. The writing in of the output signal of the decision logic into the shift register always takes place at the moment a clock signal from the measurement timer reaches the clock input of the shift register 32.

With the beginning of the next measurement interval, the latches 30 are released (contents erased), in order to store anew the signals then present at the inputs g, b,c,e and f. If these signals have not changed in the meanwhile, the logic value "1" will again appear at the output h of the decision logic 28, and upon the occurrence of the next clock pulse will be entered into the shift register 32. If in the next measurement interval "music" is again found by the decision logic, there will then appear three "music" decisions at the parallel outputs of the shift register 32. The decision logic 28 has at this point identified the transmitter to which the receiver is tuned as a transmitter providing a music program. An "ok" signal is then dispatched by the AND-gate 34 to the control logic 37, which then supplies a reset pulse for resetting the counter 33 and the shift register 32 to their respective initial conditions.

In the case in which, for example, the "music" decision is reached in only two of three successive measurement intervals, the logic value "1" will appear at only two of the three parallel outputs of the shift register 32 that are connected to the AND-gate 34. In such a case, additional measurements, a maximum of two of them, are carried out automatically, and the results obtained as described above, are clocked into the shift register 32. This procedure will be concluded either when three successive decisions produce the logic value "1" and, as above described, an "ok" signal is provided to the control logic 37, or else by the counter 33 reaching the count "5", breaking off the measurement procedure through the gate 36. Therefore, if after five successive measurement procedures, no "ok" signal is provided to the control logic 37, and instead a measurement termination signal reaches the control logic 37 from the counter 33, the control logic 37 then sets into operation the scanning function of the receiver, which then stops on the next adequately received transmitter signal. The above-described investigation steps are then repeated.

Figure 4:
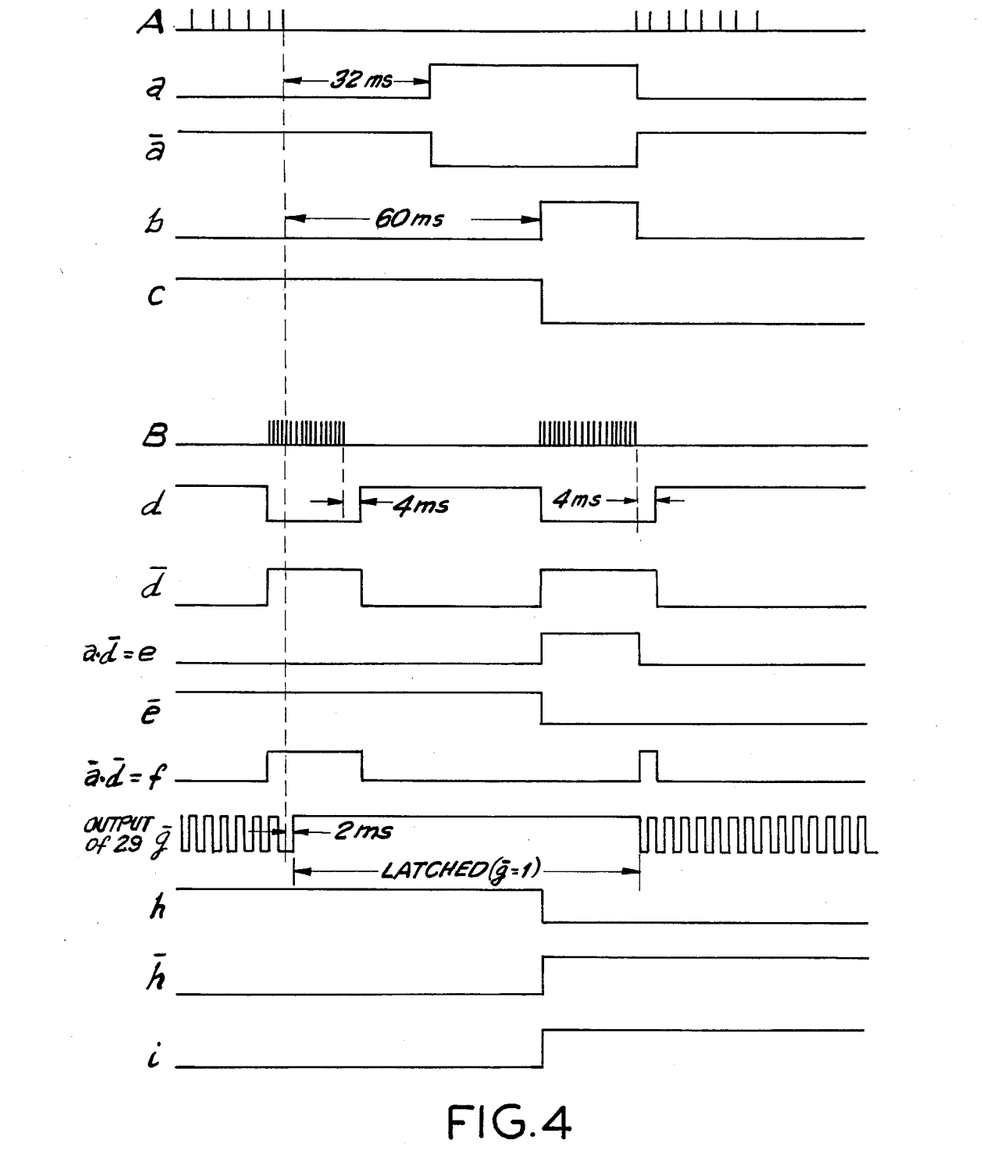
FIG. 4 is a timing diagram showing the state of the circuits of FIGS. 2 and 3 during reception of a portion of a speech signal
Figure 5:
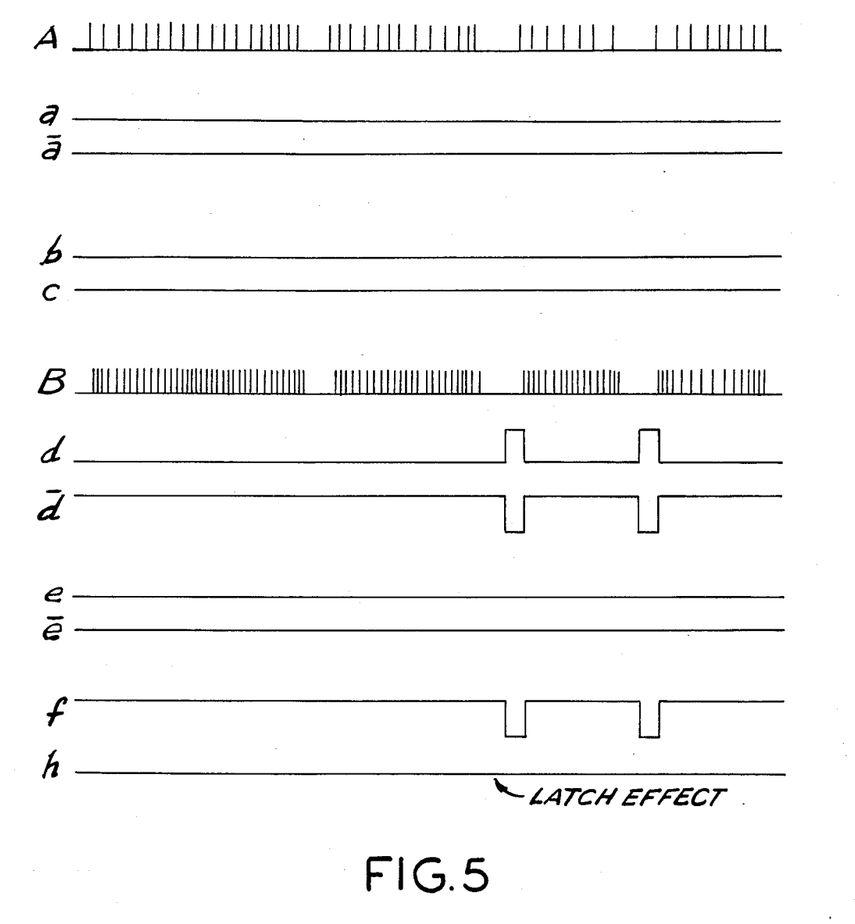
FIG. 5 is a timing diagram showing the state of condition of the circuits of FIGS. 2 and 3 during the reception of a portion of a music signal.

FIGS. 4 and 5 illustrate the operation of FIGS. 2 and 3 further by showing the time course of various signals referred to in the foregoing description, in FIG. 4 for a speech signal and in FIG. 5 for a music signal.

In FIG. 4, the top line shows the signals at terminal A, shown as an output in FIG. 1 and as an input in FIG. 2. These signals are a series of spikes produced by the differentiating circuit 20 of FIG. 1. As illustrated in FIG. 4, there is a pause exceeding 60 ms in length, which in a speech signal occurs at least once in every 500 ms period.

The sixth line of FIG. 4 similarly illustrates the signal at the terminal B, which is an output in FIG. 1 and an input in FIG. 2. Since this is the signal from the high-frequency component, whereas A shows the signal of the low-frequency component, the pause shown in the sixth line of FIG. 4 is shorter than the pause shown in the first line for the low-frequency component, resulting from speech ending with a small amount of hissing sound before the pause is complete and beginning with hissing or explosive sounds before the voiced sounds appear in the top line. As shown in FIG. 4, the high frequency component B provides no pulses before the hissing sound just mentioned or after the hissing or explosive sounds that come after the pause common to signals A and B.

The second line of FIG. 4 shows the signal at a in FIG. 2, namely the output of monoflop 23, which is one of the inputs of the logic correlation circuit 27. As indicated by the arrow on the monoflop 23, when it is triggered, the monoflop 23 goes from its positive output voltage to its negative output voltage for a period of 32 ms. Each spike of the first line of FIG. 4 is a trigger for the monoflop 23, so that the monoflop does not return to its normal logic "1" signal until 32 ms after the beginning of the pause. When the spikes reappear on the first line of FIG. 4, the monoflop output a returns to logic "0".

The third line of FIG. 4 shows the inverse of the second line, thus the output of the inverter 51 of FIG. 2, which is furnished to the gate 52 in the logic circuit 27.

The fourth line of FIG. 4 shows the signal at terminal b of FIG. 2, which is an input in FIG. 3 and is simply the output of monoflop 24. This signal is like the signal on the second line, except that the monoflop period is 60 ms instead of 32 ms.

As shown in FIG. 2, the signal just discussed is the input that triggers monoflop 25. It is assumed in FIG. 4 that there have been no previous pauses within the past 500 ms at the beginning of the time period illustrated in FIG. 4. Consequently, the output of monoflop 25, which appears on terminal c and is shown in the fifth line of FIG. 4, is at logic value "1" until the output of monoflop 24 goes positive, starting a period of 500 ms during which the output of monoflop 25 then remains at logic value "0".

The seventh line of FIG. 4 shows the output of monoflop 26, which appears at point d and makes clear that the monoflop does not revert to the higher value output until 4 ms after the last trigger appearing in the line immediately above. The eighth line in FIG. 4 shows the inverse of the seventh line, thus the output of the inverter 48, which supplies one input of each of the gates 52 and 53 of the logic circuit 27 of FIG. 2. The ninth line of FIG. 4 shows the output of gate 53 just mentioned, which appears at terminal e in FIGS. 2 and 3.

The tenth line of FIG. 4 shows the output of inverter 61 of FIG. 3.

When the input at terminal e goes positive, causing the input of the inverter 61 to go positive, the output of the inverter 61 goes from logic "1" to logic "0". The output of inverter 61 does not return to logic "1" after the input e goes back to "0", because the positive value that had occurred is stored in the latch 30 and does not return to logic value "0" until all the latches 30 are reset by the control logic 37. The output of inverter 62, for similar reasons, remains at logic value "0", even after input c at the left of FIG. 3 drops down to logic value "0" as shown on the fifth line of FIG. 4. The output value of inverter 62 is not shown on FIG. 4, since it would in this case simply remain at logic value "0" during the whole period.

The eleventh line of FIG. 4 shows the output of gate 52 of FIG. 2 which appears at terminal f. It starts out at logic value "1", because both the third line and the eighth line of FIG. 4 are at logic value "1", but drops to logic value "0" as the signal shown on the eighth line changes. By the time that signal changes back, the signal on the third line keeps the signal on the eleventh line from changing back, and the latter change does not take place until the signal on the third line of FIG. 4 also returns to logic value "1".

The twelfth line of FIG. 4 illustrates the input of the inverter 29 of FIG. 3. Since the comparator 18 of FIG. 1 takes as much as 2 ms to return to its initial higher output value, there is a 2 ms delay before the signal on the twelfth line of FIG. 4 becomes steady at logic value "1" during the pause in the low-frequency signal component under investigation. The relatively slow response of the comparator 18 does not necessarily hold for the comparator 19 in the branch of the circuit of FIG. 1 dealing with the high-frequency component.

The thirteenth line of FIG. 4 shows the output of gate 64 which furnishes the signal h. This signal drops from logic value "1" to logic value "0" as soon as the signal e shown on the tenth line of FIG. 4 does the same because f, after the latch, is stored at logic 1.

The fourteenth line of FIG. 4 shows the inverse of the thirteenth line, thus representing the output of the inverter 66 of FIG. 3.

The bottom line of FIG. 4 is the output of the gate 67 of FIG. 3, which appears at the terminal i. It starts off at logic value "0" and cannot go to logic value "1" until the signals respectively on the fourth, twelfth and fourteenth lines have gone to logic value "1" and also the output of OR-gate 69, which is not changed by the already discussed output of inverter 62, which stays at "0" in the illustrated example throughout the period of time shown, but which goes to logic value "1" at the same time that the latched signal e goes to logic value "1".

FIG. 5 shows the operation of the circuits of FIG. 2 for a music signal. In this case the first and sixth lines show spikes respectively from the differentiating circuits 20 and 21 which have only short pauses at approximately the same moments, except for a pause in the high-frequency component that does not occur in the low-frequency component. Since all of these pauses are less than 30 ms, the signals on the second, third, fourth, fifth, ninth and tenth lines are all steady, respectively at 0, 1, 0, 1, 0 and 1. The seventh line, because of the 4 ms time constant of monoflop 26, shows a signal briefly going to logic value "1", and the signal on the eighth line accordingly goes briefly, at the same time, to logic value "0", while the signal on the eleventh line does likewise.

The signal on the bottom line of FIG. 5, which is the output of gate 64 which supplies signal h in FIG. 3, is unaffected at logic value "1", because the signal on the eleventh line is latched at logic value "1" before it gets to the gate 64.

Figure 6:
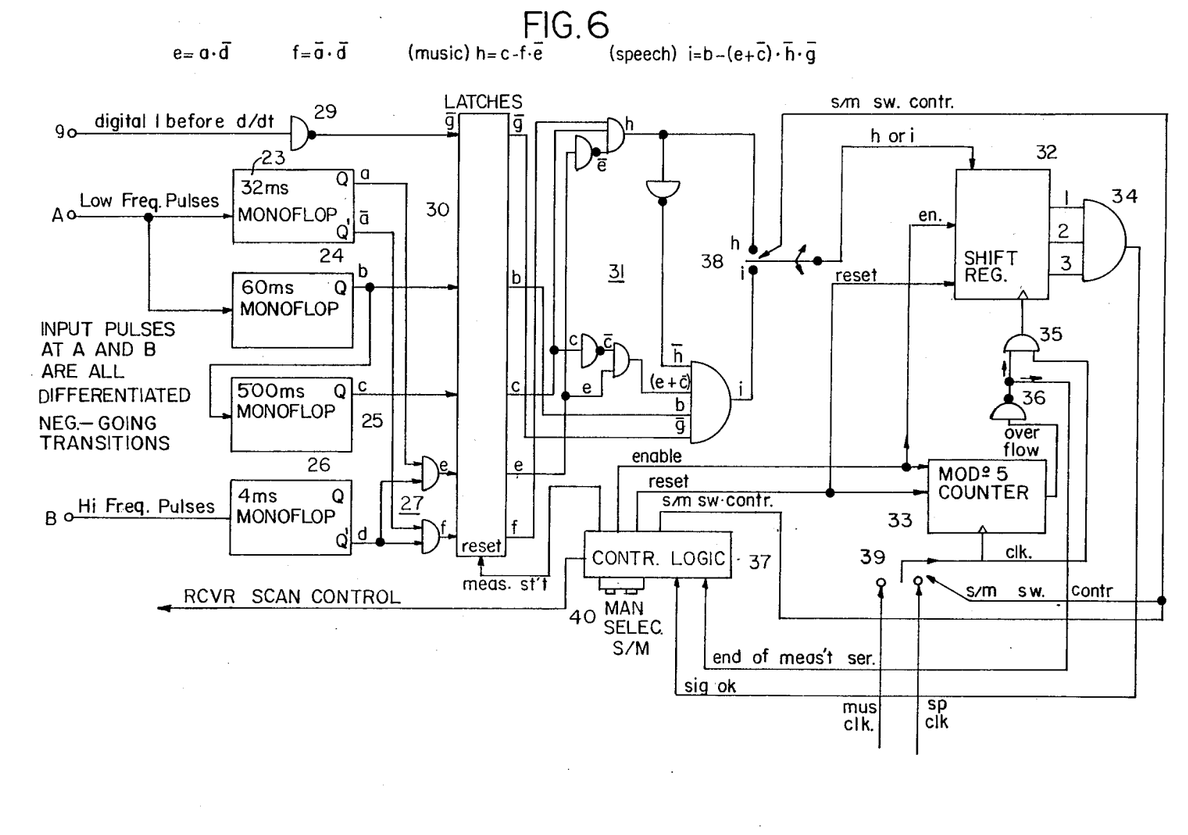
FIG. 6 is a condensed block diagram corresponding to FIGS. 2 and 3 emphasizing the logic operations of the circuits.

FIG. 6 is a condensation of FIGS. 2 and 3 emphasizing the logic scheme rather than circuit connections including statements of the definitions of the criteria for identifying music and speech respectively, already set forth above, but not set forth in the drawings, to provide a more compact outline of the logic scheme of the illustrated embodiment of the invention. It is not necessary to describe it in detail, since the description has already been given in connection with FIGS. 2 and 3 and the reference numerals of FIGS. 2 and 3 are provided in FIG. 6 so that the description of FIGS. 2 and 3 can be reread for any portion that at this point needs to be enlightened by further description.

Although the invention has been described with reference to a particular illustrative embodiment, it will be recognized that modifications and variations are possible within the inventive concept. Thus the particular time constants of the four monoflops shown in FIG. 2 need not closely approximate the values given therein. In general, instead of 32 ms, the time constant of the monoflop 23 may quite satisfactorily be anywhere within the range from 10 to 50 ms. Likewise, instead of 60 ms, the time constant of the monoflop 24 may quite satisfactorily be anywhere within the range from 50 to 200 ms, the time constant of the monoflop 25 instead of being 500 ms, may quite satisfactorily be anywhere within the range from 400 to 2000 ms and the time constant of the monoflop 26, instead of being 4 ms, may quite satisfactorily within the range from 3 to 50 ms.

The clock period for the counter 33 is preferably in the range from 125 ms to 500 ms for music and from 500 ms to 1500 ms for speech. Exact recommended values are 250 ms for music and 1000 ms for speech.

We claim:

1. Electric circuit for automatic switching of a sound reproduction and signal apparatus for exercising a selected choice, among selectable signals, between speech and music sound reproduction signals, comprising:

means (40) for registering said selected choice;
means (12,13) for subjecting a selectable or selected sound reproduction signal, to be tested for conformance with a choice registered in said registering means, to separation of said signal into a low-frequency signal component and a high-frequency signal component, said low-frequency signal component containing substantially all component frequencies of said sound reproduction signals which are less than 3 kHz;
means (14–19) for converting said low-frequency and high-frequency signal components respectively into first and second sequences of amplitude-limited pulses;
first timing means (24) responsive to said first sequence of amplitude-limited pulses for detecting pauses in said low-frequency signal component which pauses exceed a first predetermined duration;
second timing means (25) for identifying periods of time in which said pauses detected by said first timing means succeed each other at intervals not exceeding a second predetermined duration;
third timing means (26) responsive to said second sequence of amplitude-limited pulses for detecting the occurrence of pauses in said high-frequency signal component exceeding a third predetermined duration which is less than said first predetermined duration;
fourth timing means (23) responsive to said first sequence of amplitude-limited pulses for detecting the occurrence of pauses in said low-frequency signal component exceeding a fourth predetermined duration which is longer than said third predetermined duration and shorter than said first predetermined duration;
first logic circuit means (27,27a) responsive to the outputs (a,d) of said first and fourth timing means for detecting the absence of a pause exceeding said third predetermined duration in said high-frequency signal component during the portion of a pause in said low-frequency signal component which exceeds said fourth predetermined duration and thereby producing a first logic output signal (e) and for detecting the absence of a pause exceeding said third predetermined duration in said high-frequency signal component during the absence of pauses exceeding said fourth predetermined duration in said low-frequency signal component and thereby producing a second logic output signal (f);
second logic circuit means (31) for dientifying a music signal by a third logic output signal (h) with reference to the respective states of said first and second logic output signals (e,f) and the state of the output (c) of said second timing means (25) and for identifying a speech signal by a fourth logic signal (i) with a reference to the respective states of said first and third logic signals (e,h) and the respective states of the outputs (b,c) of said first and second timing means (24,25), and
sound reproduction signal evaluating means (33–39) for comparing the state of said registering means (40) with the corresponding one of said third and fourth logic signals and determining in response thereto whether or not the sound reproduction signal selected for test is of the character selected by said registering means.

2. Circuit as defined in claim 1, in which said second predetermined duration is of a magnitude in the range between 400 and 2000 ms.

3. Circuit as defined in claim 1, in which said first predetermined duration is of a magnitude in the range between 50 and 200 ms.

4. Circuit as defined in claim 1 in which differentiating means (20,21) are interposed between the respective outputs of said converting means and the inputs of said timing means respectively responsive to said first and second sequences of amplitude limited pulses.

5. Circuit as defined in claim 4 in which a noise-blanker (22) is interposed between said means for converting said low-frequency signal component into said first series of amplitude-limited pulses and said differentiating means (20) in which a signal inverter (29) is connected to the output of said noise-blanker (22) to provide a supplementary speech-indicating-factor signal ($\bar{g}$) at the output of said inverter, and in which said second logic circuit means (31) are constituted to identify a speech signal with reference not only to the respective states of said first and third logic signals (e,h) and of the outputs (b,c) of said first and second timing means, but also with reference to said supplementary speech-indicating-factor signal ($\bar{g}$).

6. Circuit as defined in claim 5, in which means (39) are provided for selecting measurement timing intervals between measurement clock pulses of which the intervals are of a magnitude suitable for speech or music signal identification as selected according to the state of said registering means (40) designating a selection between speech and music, and in which latches are provided for storing output signals of said first logic circuit means (27,27a) and said first and second timing means (24,25) during a measuring period and in which said second logic circuit means (31) are constituted to identify a music signal in response to the absence of pauses exceeding said first predetermined duration in said low-frequency signal component, the absence of pauses exceeding said third predetermined duration in said high-frequency signal component during the absence of pauses exceeding said fourth predetermined duration in said low-frequency signal component, and the occurrence of a pause in said high-frequency signal component during the portion of every pause in said low-frequency component which exceeds said fourth predetermined duration.

7. Circuit as defined in claim 1, in which said first predetermined duration is approximately 60 ms.

8. Circuit as defined in claim 6, in which said second logic circuit means (31) are constituted for identifying a speech signal when within a measuring period, at least the following conditions have been detected: the absence of identification of a music signal; the presence of a pause in said low-frequency signal component which has exceeded said first predetermined duration; the presence of a quiescent condition of the output of said noise blanker, and either the absence of occurrence of a pause exceeding said third predetermined duration in said high-frequency signal component during the portion exceeding said fourth predetermined duration of a pause in said low-frequency signal component or else the continued existence of an interval less than said second predetermined duration since the last previous time when a pause in said low-frequency signal component began to exceed said first predetermined duration.

9. Circuit as defined in claim 7, in which said third predetermined duration is of a magnitude in the range between 3 and 50 ms.

10. Circuit as defined in claim 9, in which said fourth predetermined duration is of a magnitude in the range between 10 and 50 ms.

11. Circuit as defined in claim 8, in which said sound reproduction signal evaluating means include control logic (37) means and also means for storing said third logic output signals or said fourth logic output signals produced in successive measurement periods, following successive resettings of said signal storage latches, and determining only on the basis of three in succession out of five successive measurement periods, each following a resetting of the latches, a final identification of speech or music signal content, said control logic means (37) being further constituted so as to initiate a search for another signal source if the operation of said sound reproduction signal evaluating means does not confirm a choice registered in said registering means said third of said fourth logic output signals being selected for storage according to said choice registered in said registering means.

12. Circuit as defined in claim 11, in which a counter is provided in said sound reproduction signal evaluating means for counting said measurement periods and thereby counting out a measurement cycle of five measurement periods.

13. Circuit as defined in claim 1, in which means (39) are provided for selecting measurement timing intervals between measurement clock pulses of which the intervals are of a magnitude suitable for speech or music signal identification as selected according to the state of said registering means (40) designating a selection between speech and music, and in which latches are provided for storing output signals of said first logic circuit means (27,27a) and said first and second timing means (24,25) during a measuring period and in which said second logic circuit means (31) are constituted to identify a music signal in response to the absence of pauses exceeding said first predetermined duration in said low-frequency signal component, the absence of pauses exceeding said third predetermined duration in said high-frequency signal component during the absence of pauses exceeding said fourth predetermined duration in said low-frequency signal component, and the occurrence of a pause in said high-frequency signal component during a portion of every pause in said low-frequency component which exceeds said fourth predetermined duration.

14. Circuit as defined in claim 1 in which said second logic circuit means (31) are constituted for taking account, in the identification of a speech signal, of the state (g) of said first sequence of amplitude-limited pulses.

15. Circuit as defined in claim 1 in which said signal component separating means are constituted to produce said high-frequency signal component in a form in which said high-frequency signal component contains substantially no component frequencies below 6 kHz and contains substantially all the component frequencies of said sound reproduction signal lying between 6 kHz and 10 kHz.

16. Circuit as defined in claim 13 in which said signal component separating means are constituted to produce said high-frequency signal component in a form in which said high-frequency signal component contains substantially no component frequencies below 6 kHz and contains substantially all the component frequencies of said sound reproduction signal lying between 6 kHz and 10 kHz.

17. Circuit as defined in claim 4 in which said signal component separating means are constituted to produce said high-frequency signal component in a form in which said high-frequency signal component contains substantially no component frequencies below 6 kHz and contains substantially all the component frequencies of said sound reproduction signal lying between 6 kHz and 10 kHz.

18. Circuit as defined in claim 24 in which said signal component separating means are constituted to produce said high-frequency signal component in a form in which said high-frequency signal component contains substantially no component frequencies below 6 kHz and contains substantially all the component frequencies of said sound reproduction signal lying between 6 kHz and 10 kHz.

19. Circuit as defined in claim 5 in which said signal component separating means are constituted to produce said high-frequency signal component in a form in which said high-frequency signal component contains substantially no component frequencies below 6 kHz and contains substantially all the component frequencies of said sound reproduction signal lying between 6 kHz and 10 KHz.

20. Circuit as defined in claim 6 in which said signal component separating means are constituted to produce said high-frequency signal component in a form in which said high-frequency signal component contains substantially no component frequencies below 6 kHz and contains substantially all the component frequencies of said sound reproduction signal lying between 6 kHz and 10 kHz.

* * * * *